(12) United States Patent
Chien et al.

(10) Patent No.: US 11,367,795 B2
(45) Date of Patent: Jun. 21, 2022

(54) SEMICONDUCTOR DEVICE AND MANUFACTURING METHOD THEREOF

(71) Applicant: Au Optronics Corporation, Hsinchu (TW)

(72) Inventors: Ting-Fong Chien, Hsinchu (TW); Po-Liang Yeh, New Taipei (TW); Chen-Chung Wu, Kaohsiung (TW); Chia-Ming Chang, Hsinchu (TW); Chun-An Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 116 days.

(21) Appl. No.: 17/088,525

(22) Filed: Nov. 3, 2020

(65) Prior Publication Data
US 2021/0050454 A1 Feb. 18, 2021

Related U.S. Application Data

(62) Division of application No. 16/177,464, filed on Nov. 1, 2018, now abandoned.

(30) Foreign Application Priority Data

May 2, 2018 (TW) ................................ 107114836

(51) Int. Cl.
| | | |
|---|---|---|
| *H01L 29/786* | (2006.01) | |
| *H01L 29/417* | (2006.01) | |
| *H01L 29/423* | (2006.01) | |
| *H01L 29/49* | (2006.01) | |

(Continued)

(52) U.S. Cl.
CPC .... *H01L 29/7869* (2013.01); *H01L 21/28061* (2013.01); *H01L 23/53228* (2013.01);
(Continued)

(58) Field of Classification Search
CPC ............... H01L 29/45; H01L 29/41733; H01L 29/42384; H01L 29/4908; H01L 29/66742;
(Continued)

(56) References Cited

U.S. PATENT DOCUMENTS

| | | |
|---|---|---|
| 7,511,300 B2 | 3/2009 | Lee et al. |
| 8,178,973 B2 | 5/2012 | Han et al. |

(Continued)

FOREIGN PATENT DOCUMENTS

| | | |
|---|---|---|
| CN | 101132011 | 2/2008 |
| CN | 101471327 | 7/2009 |

*Primary Examiner* — Jose R Diaz
(74) *Attorney, Agent, or Firm* — JCIPRNET

(57) ABSTRACT

A semiconductor device including a first substrate and a thin film transistor disposed on the first substrate is provided. The thin film transistor includes a gate, a semiconductor pattern, a first insulating layer, a source and a drain. The first insulating layer is disposed between the gate and the semiconductor pattern. The source and the drain are separated from each other and disposed corresponding to the semiconductor pattern. At least one of the source and the drain has a first copper patterned layer and a first copper oxynitride patterned layer. The first copper oxynitride patterned layer covers the first copper patterned layer. The first copper patterned layer is disposed between the first copper oxynitride patterned layer and the first substrate. Moreover, a manufacturing method of the semiconductor device is also provided.

9 Claims, 10 Drawing Sheets

(51) Int. Cl.
*H01L 23/532* (2006.01)
*H01L 21/28* (2006.01)
*H01L 29/06* (2006.01)
*H01L 29/66* (2006.01)

(52) U.S. Cl.
CPC .. *H01L 23/53233* (2013.01); *H01L 23/53238* (2013.01); *H01L 29/0642* (2013.01); *H01L 29/41733* (2013.01); *H01L 29/42384* (2013.01); *H01L 29/4908* (2013.01); *H01L 29/66742* (2013.01)

(58) Field of Classification Search
CPC ............. H01L 29/7869; H01L 29/0642; H01L 21/28061; H01L 21/02172; H01L 21/02175; H01L 23/53228–53238
See application file for complete search history.

(56) References Cited

U.S. PATENT DOCUMENTS

| | | | |
|---|---|---|---|
| 8,270,178 B2* | 9/2012 | Chen | H01L 27/124 361/772 |
| 8,760,593 B2* | 6/2014 | Chen | H01L 29/458 438/34 |
| 2008/0017862 A1 | 1/2008 | Lee et al. | |
| 2009/0162982 A1 | 6/2009 | Lee et al. | |
| 2009/0166640 A1 | 7/2009 | Han et al. | |
| 2011/0309510 A1 | 12/2011 | Lee et al. | |
| 2013/0122323 A1* | 5/2013 | Miki | G09F 9/30 428/632 |
| 2014/0091306 A1* | 4/2014 | Miki | H01L 29/458 257/59 |

* cited by examiner

SEMICONDUCTOR DEVICE AND MANUFACTURING METHOD THEREOF

CROSS-REFERENCE TO RELATED APPLICATION

This is a divisional application of and claims the priority benefit of U.S. patent application Ser. No. 16/177,464, filed on Nov. 1, 2018, now pending. The prior U.S. patent application Ser. No. 16/177,464 claims the priority benefit of Taiwan application serial no. 107114836, filed on May 2, 2018. The entirety of each of the above-mentioned patent applications is hereby incorporated by reference herein and made a part of this specification.

BACKGROUND OF THE INVENTION

Field of the Invention

The invention relates to an electronic device and a manufacturing method thereof, and particularly related to a semiconductor device and a manufacturing method thereof.

Description of Related Art

Copper (Cu) has advantages such as high electric conductivity, low electrical resistance, and low cost. Therefore, copper is often used as one of the materials of a source and a drain of a thin film transistor. However, when the adhesion of copper and the thin film thereon is poor, copper is prone to be damaged owing to external moisture, and the electrical property of the thin film transistor is thus affected. For example, when the copper layers of the source and the drain deteriorate, an I-V curve of a drain current and a gate voltage of the thin film transistor offsets, and thus leads to current leakage. At this time, if a display panel is adopted the thin film transistor as a pixel switch, the thin film transistor fails to normally turn off pixels, and an issue of display error is occurred. For example, black checkered screen in a black and white checkered screen are whitened.

SUMMARY OF THE INVENTION

The invention provides a semiconductor device, which is less likely to have an issue of leakage current, and has better reliability.

An embodiment of the invention provides a manufacturing method of the semiconductor device, which can realize a semiconductor device that is less likely to have an issue of leakage current and has better reliability.

The embodiment of the invention includes a first substrate and a thin film transistor. The thin film transistor is disposed on the first substrate. The thin film transistor includes a gate, a semiconductor pattern, a first insulating layer, a source and a drain. The first insulating layer is disposed between the gate and the semiconductor pattern. The source and the drain are separated from each other and disposed corresponding to the semiconductor pattern. At least one of the source and the drain has a first copper patterned layer and a first copper oxynitride patterned layer. The first copper oxynitride patterned layer covers the first copper patterned layer. The first copper patterned layer is disposed between the first copper oxynitride patterned layer and the first substrate.

In an embodiment of the invention, the first copper patterned layer has a first top surface, a first bottom surface and a first sidewall connected between the first bottom surface and the first top surface. In addition, the first copper oxynitride patterned layer covers the first top surface and the first sidewall.

In an embodiment of the invention, the at least one of the source and the drain further has the first molybdenum patterned layer. The first copper patterned layer is disposed between the first copper oxynitride patterned layer and the first molybdenum patterned layer.

In an embodiment of the invention, the semiconductor device further includes a data line, electrically connected to the source of the thin film transistor. The data line has the second copper patterned layer and the second copper oxynitride patterned layer. The second copper oxynitride patterned layer covers the second copper patterned layer. The second copper patterned layer is disposed between the second copper oxynitride patterned layer and the first substrate.

In an embodiment of the invention, the second copper patterned layer has a second top surface, a second bottom surface and a second sidewall connected between the second bottom surface and the second top surface. In addition, the second copper oxynitride patterned layer covers the second top surface and the second sidewall.

In an embodiment of the invention, the data line further has a second molybdenum patterned layer. The second copper patterned layer is disposed between the second copper oxynitride patterned layer and the second molybdenum patterned layer.

In an embodiment of the invention, the first copper oxynitride patterned layer directly contacts with the first copper patterned layer.

In an embodiment of the invention, the semiconductor device further includes a silicon oxide layer, covering the first copper oxynitride patterned layer and contacting with the first copper oxynitride patterned layer.

In an embodiment of the invention, the semiconductor device further includes a pixel electrode, electrically connected to the drain.

An embodiment of the invention provides a manufacturing method of the semiconductor device including the following steps: providing a first substrate; forming a gate, a first insulating layer, a semiconductor pattern on the first substrate, wherein the first insulating layer is disposed between the gate and the semiconductor pattern; forming a copper material layer on the first substrate by using a physical vapor deposition; introducing nitrogen to form a copper nitride material layer on the copper material layer; patterning the copper material layer and the copper nitride material layer to form a first copper material layer and a first copper nitride material layer; and introducing nitrous oxide, nitrous oxide reacting with first copper material layer and the first copper nitride material layer to form a first copper oxynitride patterned layer and a first copper patterned layer, the first copper oxynitride patterned layer covering the first copper patterned layer, wherein the first copper patterned layer and the first copper oxynitride patterned layer comprise a source and a drain, and the source and the drain are separated from each other and disposed corresponding to the semiconductor pattern.

In an embodiment of the invention, the manufacturing method of the semiconductor device further includes: introducing silane after forming the first copper oxynitride patterned layer, the silane reacting with the nitrous oxide to form a silicon oxide layer, wherein the silicon oxide layer covers the source and the drain.

According to the above, in the semiconductor device and the manufacturing method thereof of the embodiment of the invention, the surface of at least one of the source and the drain has a copper oxynitride patterned layer, and/or the surface of the data line has a copper oxynitride patterned layer. The copper oxynitride patterned layer has a dense material property, and/or the adhesion of the copper oxynitride patterned layer and the silicon oxide layer is excellent. Accordingly, external moisture is not easy to invade into the copper patterned layer of at least one of the source and the drain. Therefore, the semiconductor of the embodiment of the invention has good reliability.

In order to make the aforementioned features and advantages of the disclosure more comprehensible, embodiments accompanied with figures are described in detail below.

DESCRIPTION OF THE EMBODIMENTS

Figure 1A:
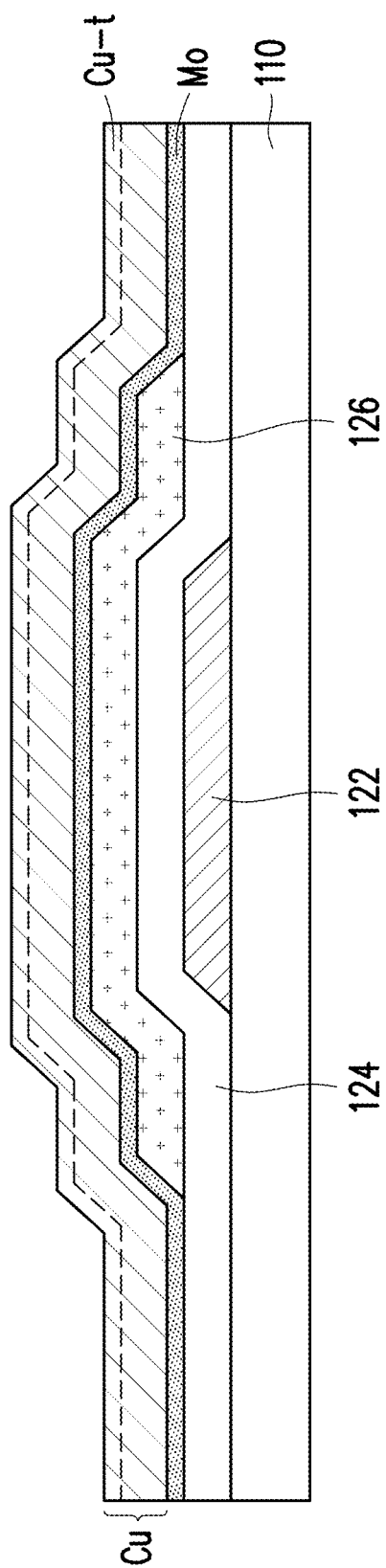
FIG. 1A to FIG. 1F are manufacturing process profile diagrams according to an embodiment of the semiconductor device of the invention.

In the drawings, for clarity, the thickness of layers, films, plates, area, and so on are magnified. Throughout the specification, the same reference numerals indicate the same elements. It should be understood that when an element such as a layer, a film, an area, or a substrate is indicated to be "on" another element or "connected to" another element, it may be directly on another element or connected to another element, or an element in the middle may be existed. In contrast, when an element is indicated to be "directly on another element" or "directly connected to" another element, an element in the middle is not existed. For example, "connect" indicated in the specification may indicate physically and/or electrically connect. Furthermore, "electrically connect" or "coupled to" may be indicated that other element exists between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may be indicated that within one or more standard deviations of the value, or within ±30%, ±20%, ±10%, ±5%. Furthermore, the usages of "approximately", "similar to" or "substantially" indicated throughout the specification may be referred to a more acceptable deviation scope or standard deviation depending on optical properties, etching properties, or other properties, and all properties may not be applied with one standard deviation.

Unless otherwise defined, the terms used throughout the specification (including both technical and scientific terms) has the same meaning understood by people skilled in the art. It should be further understood that, terms such as those defined in commonly used dictionaries should be interpreted as having meanings consistent with the meanings in the prior art and the context of the invention, and shall not be interpreted as an idealized or overly formal meaning, unless they are definitely defined in the content.

Exemplary embodiments are described herein with reference to cross section illustrations that are schematic illustrations of idealized embodiments. Therefore, variations in the shapes of the illustrations of, for example, the result of manufacturing techniques and/or tolerances, are to be expected. Thus, embodiments described herein should not be interpreted as a certain shape limited to areas illustrated in the context, but are to include deviations in shapes that result, for example, from manufacturing. For instance, illustrated or described flat areas may usually have rough and/or non-linear features. Besides, the illustrated acute angle may be round. Therefore, areas illustrated in drawing are substantially schematic, their shapes are not intended to illustrate the exact shapes of the areas, and they are not intended to limit the claimed scopes.

References of the exemplary embodiments of the invention are made in detail. Examples of the exemplary embodiments are illustrated in the drawings. If possible, the same reference numerals in the drawings and the descriptions are indicated the same or similar parts.

FIG. 1A to FIG. 1F are manufacturing process profile diagrams according to an embodiment of the semiconductor device of the invention. FIG. 2 is a top schematic diagram of the semiconductor device of an embodiment of the invention. Specifically, the cross section of FIG. 1F corresponds to the cross section line A-A' of FIG. 2.

Figure 2:
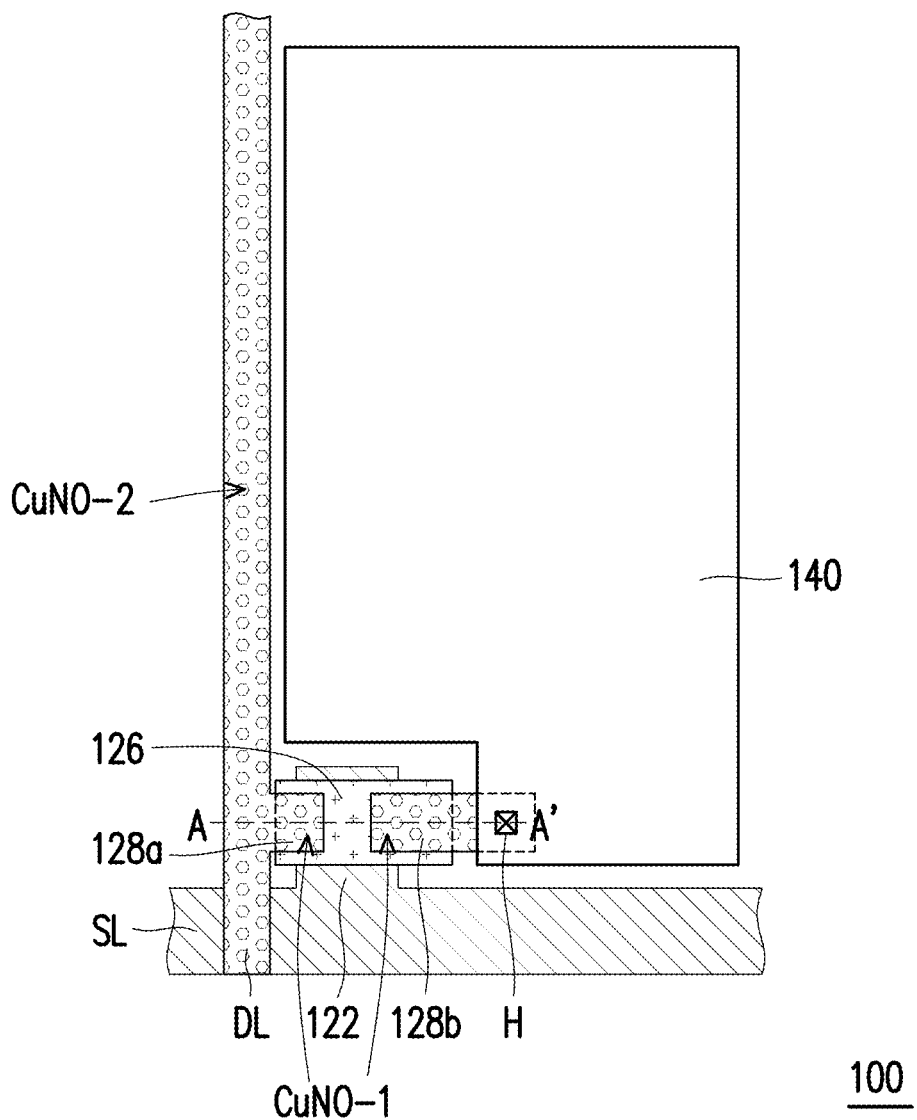
FIG. 2 is a top schematic diagram of the semiconductor device of an embodiment of the invention.

Please refer to FIG. 1A. In the embodiment, firstly, a first substrate 110 is provided. Then, a gate 122, a first insulating layer 124 and a semiconductor 126 are formed sequentially on the first substrate 110. The first insulating layer 124 covers the gate 122. The semiconductor pattern 126 is disposed on the first insulating layer 124. The first insulating layer 124 is disposed between the gate 122 and the semiconductor pattern 126. In the embodiment, while forming the gate 122, a scan line SL (illustrated in FIG. 2) may be selectively formed together. However, the invention is not limited thereto.

For example, in the embodiment, by using physical vapor deposition (PVD), the gate 122 and the scan line SL are formed. The material of the gate 122 may be copper (Cu), chromium (Cr), tungsten (W), titanium (Ti), tantalum (Ta), molybdenum (Mo), other suitable conductive materials, or the combination of at least two of the aforementioned materials. However, the invention is not limited thereto.

For example, in the embodiment, by using chemical vapor deposition (CVD), the first insulating layer 124 is formed. However, the invention is not limited thereto. The material of the first insulating layer 124 may be silicon dioxide ($SiO_2$), silicon nitride ($Si_3N_4$), hafnium dioxide ($HfO_2$), or the combination of at least two of the aforementioned materials. However, the invention is not limited thereto. In other embodiments, the first insulating layer 124 may also be other high dielectric constant materials, so as to effectively electrically isolate the gate 122 and the semiconductor pattern 126.

For example, in the embodiment, by using physical vapor deposition, a semiconductor material layer (not illustrated) is formed. Then, the semiconductor material layer is patterned, and the semiconductor pattern 126 is thus formed. In the embodiment, the semiconductor pattern 126 is, for example, a multi-layer film stacking structure. The multi-layer film may include semiconductor materials (not illustrated) and an ohmic contact layer (not illustrated). The semiconductor material of the semiconductor pattern 126 may be selectively adopted indium gallium zinc oxide (IGZO), hafnium indium zinc oxide (HIZO), indium zinc oxide (IZO) or other metal oxide, so that the subsequently formed thin film transistor 120 (illustrated in FIG. 1D) still has high electron mobility in the case of semiconductor pattern 126 adopted a small-area. However, the invention is not limited thereto. In other embodiments, the semiconductor material of the semiconductor pattern 126 may also be adopted as other suitable kinds of semiconductors. However, the invention is not limited whether the semiconductor pattern 126 has to include the ohmic contact layer.

Please refer to FIG. 1A. Then, in the embodiment, the molybdenum material layer Mo and the copper material layer Cu may be selectively and subsequently formed on the first substrate 110, where the molybdenum material layer Mo covers the semiconductor pattern 126, and the copper material layer Cu is disposed on the molybdenum material layer Mo. For example, in the embodiment, by using physical vapor deposition (e.g., sputtering), the molybdenum material layer Mo and the copper material layer Cu are formed. However, the invention is not limited thereto.

Figure 1B:
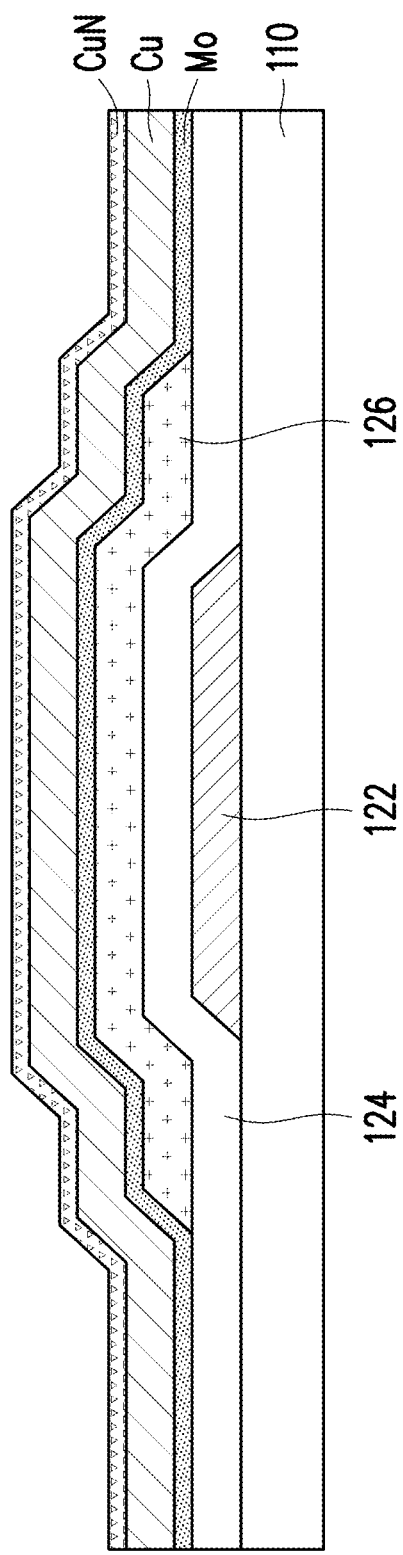

Please refer to FIG. 1B. Then, nitrogen gas ($N_2$) is introduced, so as to form a copper nitride layer CuN on the copper material layer Cu. Please refer to FIG. 1A and FIG. 1B. In detail, after the copper material layer Cu having a predetermined film thickness is formed (as illustrated in FIG. 1A), nitrogen is introduced to react nitrogen with a top area Cu-t of the copper material layer Cu (illustrated in FIG. 1A) to form the copper nitride material layer CuN (as illustrated in FIG. 1B). The copper nitride material layer CuN may be illustrated as chemical formula $CuN_m$, where m may be a positive integer.

Figure 1C:
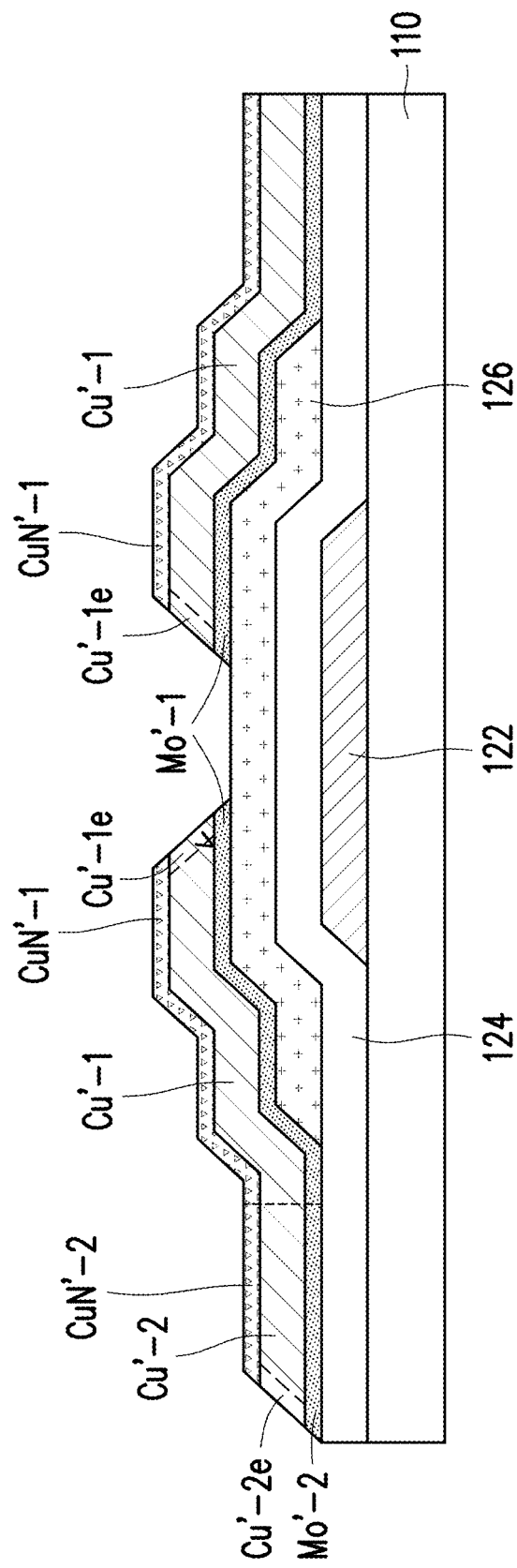

Please refer to FIG. 1B and FIG. 1C. Then, the copper nitride material layer CuN, the copper material layer Cu and the molybdenum material layer Mo are patterned, such that the copper nitride material layer CuN forms a first copper nitride material layer CuN'-1 and a second copper nitride material layer CuN'-2, the copper material layer Cu forms the first copper material layer Cu'-1 and the second copper material layer Cu'-2, and the molybdenum material layer Mo forms a first molybdenum layer Mo'-1 and a second molybdenum layer Mo'-2. In the embodiment, the same patterned photoresist (not illustrated) may be used as a mask, the copper nitride material layer CuN, the copper material layer Cu and the molybdenum material layer Mo are patterned to form the first copper nitride material layer CuN'-1, the second copper nitride material layer CuN'-2, the first copper material layer Cu'-1, the second copper material layer Cu'-2, the first molybdenum material layer Mo'-1 and the second molybdenum material layer Mo'-2, where the first copper nitride material layer CuN'-1, the first copper material layer Cu'-1, and the first molybdenum material layer Mo'-1 are overlapped with each other, and the second copper nitride material layer CuN'-2, the second copper material layer Cu'-2 and the second molybdenum material layer Mo'-2 are overlapped with each other.

For example, in the embodiment, under the condition that the copper nitride material layer CuN, the copper material layer Cu and the molybdenum material layer Mo are shielded by the patterned photoresist (not illustrated), the same type of etching liquid is applied. At the same time, a part of the copper nitride material layer CuN, a part of the copper material layer Cu and a part of the molybdenum material layer Mo are not shielded by the patterned photoresist, and the part of the copper nitride material layer CuN, the part of the copper material layer Cu and the part of the molybdenum material layer Mo are removed so as to form the first copper nitride material layer CuN'-1, the second copper nitride material layer CuN'-2, the first copper material layer Cu'-1, the second copper material layer Cu'-2, the first molybdenum material layer Mo'-1 and the second molybdenum material layer Mo'-2. However, the invention is not limited thereto. In other embodiments, under the condition that the copper nitride material layer CuN, the copper material layer Cu, and the molybdenum material layer Mo are shielded by the patterned photoresist (not illustrated), a plurality of types of etching liquid are applied, and the part of the copper nitride material layer CuN, the part of the copper material layer Cu and the part of the molybdenum material layer Mo that are not shielded by the patterned photoresist may be sequentially removed.

Figure 1D:
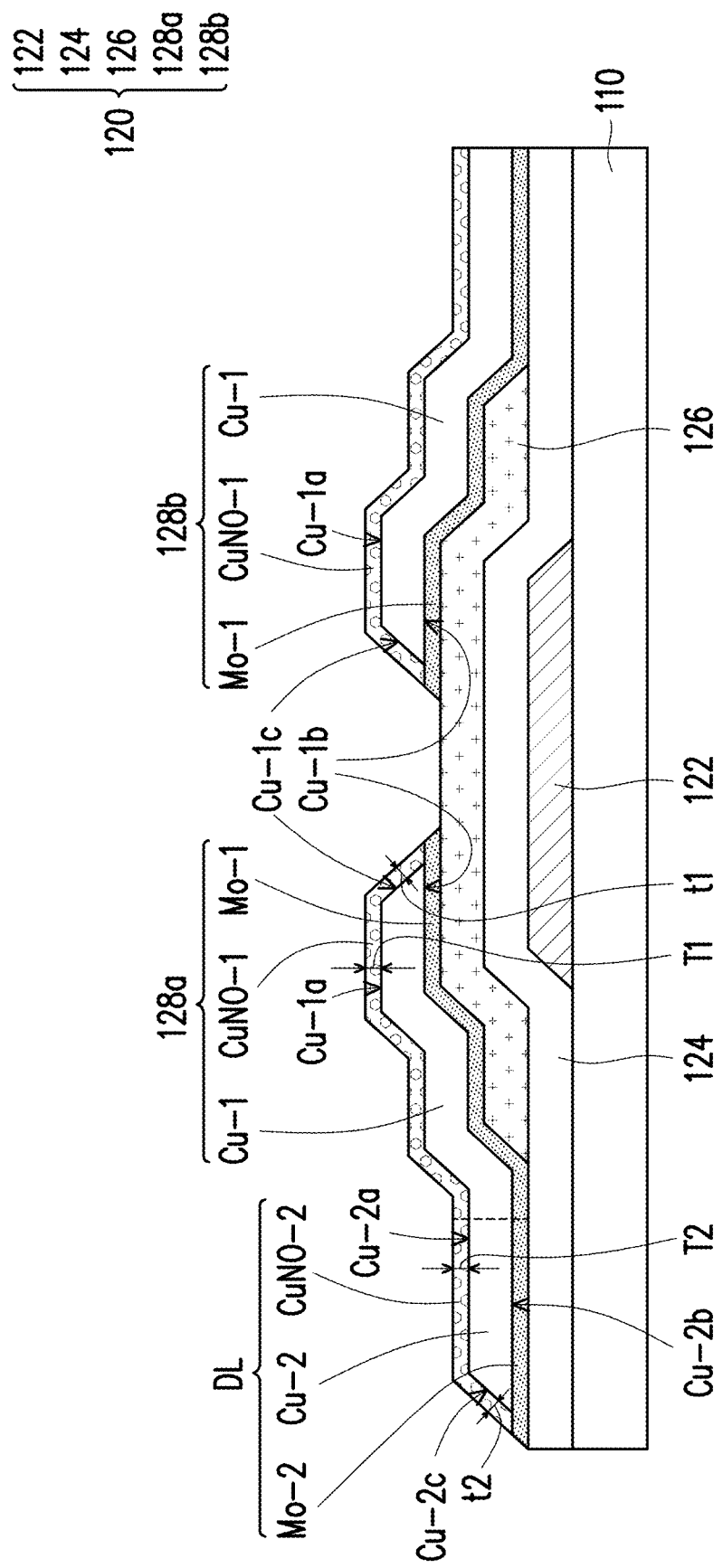

Please refer to FIG. 1C and FIG. 1D. Then, nitrous oxide ($N_2O$) is introduced. The nitrous oxide reacts at least with the first copper nitride material layer CuN'-1 and a sidewall area Cu'-1e of the first copper material layer Cu'-1 to form the first copper oxynitride patterned layer CuNO-1, where part of the first copper material layer Cu'-1, which is not exposed to nitrous oxide (that is, other area of the first copper material layer Cu'-1 except the sidewall area Cu'-1e), forms the first copper patterned layer Cu-1. The nitrous oxide reacts with the second copper nitride material layer CuN'-2 and the sidewall area Cu'-2e of the second copper material layer Cu'-2 to form the second copper oxynitride patterned layer CuNO-2, where part of the second copper material layer Cu'-2, which is not exposed in the nitrous oxide (that is, other area of the second copper material layer Cu'-2 except the sidewall area Cu'-2e) forms the second copper patterned layer Cu-2. The first copper oxynitride patterned layer CuNO-1 and the second copper oxynitride patterned layer CuNO-2 may be illustrated as chemical formula $CuN_xO_y$, where x and y are positive integers.

Please refer to FIG. 1D. In the embodiment, the first copper oxynitride patterned layer CuNO-1 covers the first copper patterned layer Cu-1. In detail, the first copper patterned layer Cu-1 has a first top surface Cu-1a, a first bottom surface Cu-1b and a first sidewall Cu-1c connected between the first bottom surface Cu-1b and the first top surface Cu-1a, whereas the first copper oxynitride patterned layer CuNO-1 covers the first top surface Cu-1a and the first sidewall Cu-1c. The first copper patterned layer Cu-1 is disposed between the first copper oxynitride patterned layer CuNO-1 and the first molybdenum patterned layer Mo-1. The first copper oxynitride patterned layer CuNO-1 may directly contact with the first copper patterned layer Cu-1. Similarly, the first copper patterned layer Cu-1 may directly contact with the first molybdenum patterned layer Mo-1. Similarly, the second copper patterned layer Cu-2 has a second top surface Cu-2a, a second bottom surface Cu-2b and a second sidewall Cu-2c connected between the second bottom surface Cu-2b and the second top surface Cu-2a, whereas the second copper oxynitride patterned layer CuNO-2 covers a second top surface Cu-2a and a second sidewall Cu-2c. The second copper patterned layer Cu-2 is disposed between the second copper oxynitride patterned layer CuNO-2 and the second molybdenum patterned layer Mo-2. The second copper oxynitride patterned layer CuNO-2 may directly contact with the second copper patterned layer Cu-2. The second copper patterned layer Cu-2 may directly contact with the second molybdenum patterned layer Mo-2.

In the embodiment, part of the first molybdenum patterned layer Mo-1, part of the first copper patterned layer Cu-1 and part of the first copper oxynitride patterned layer CuNO-1 may consist of a source 128a. Another part of the first molybdenum patterned layer Mo-1, another part of the first copper patterned layer Cu-1 and another part of the first copper oxynitride patterned layer CuNO-1 may consist of a drain 128b. The source 128a and the drain 128b are structurally separated from each other and are disposed corresponding to the semiconductor pattern 126. In the embodiment, the second molybdenum patterned layer Mo-2, the second copper patterned layer Cu-2 and the second copper oxynitride patterned layer CuNO-2 may consist a data line DL, where the data line DL and the source 128a are electrically connected. The gate 122, the first insulating layer 124, the semiconductor pattern 126, the source 128a and the drain 128b may constitute the thin film transistor 120. In the embodiment, the thin film transistor 120 is an example of a bottom gate thin film transistor (bottom gate TFT). However, the invention is not limited thereto. In other embodiments, the thin film transistor 120 may be a top gate thin film transistor (top gate TFT) or other suitable type of thin film transistor.

In the embodiment, since the forming process of the part of the first copper oxynitride patterned layer CuNO-1 on the first top surface Cu-1a is different from that of the part of the first copper oxynitride patterned layer CuNO-1 on the first sidewall Cu-1c, and the forming process of the part of the second copper oxynitride patterned layer CuNO-2 on the second top surface Cu-2a is different from that of the part of the second copper oxynitride patterned layer CuNO-2 on the second sidewall Cu-2c, a film thickness T1 of part of the first copper oxynitride patterned layer CuNO-1 on the first top surface Cu-1a may be slightly different from a film thickness t1 of part of the first copper oxynitride patterned layer CuNO-1 on the first sidewall Cu-1c, and a film thickness T2 of part of the second copper oxynitride patterned layer CuNO-2 on the second top surface Cu-2a may be slightly different from a film thickness t2 of part of the second copper oxynitride patterned layer CuNO-2 on the second sidewall Cu-2c. For example, in the embodiment, the film thickness T1 of part of the first copper oxynitride patterned layer CuNO-1 on the first top surface Cu-1a may be slightly greater than the film thickness t1 of part of the first copper oxynitride patterned layer CuNO-1 on the first sidewall Cu-1c, and the film thickness T2 of part of the second copper oxynitride patterned layer CuNO-2 on the second top surface Cu-2a may be slightly greater than the film thickness t2 of part of the second copper oxynitride patterned layer CuNO-2 on the second sidewall Cu-2c, for example, 300 Å≤T1≤600 Å, 200 Å≤t1≤500 Å, 300 Å≤T2≤600 Å, and 200 Å≤t2≤500 Å. However, the invention is not limited thereto. In other embodiments, the film thickness T1 of part of the first copper oxynitride patterned layer CuNO-1 on the first top surface Cu-1a may also be substantially equal to the film thickness t1 of part of the first copper oxynitride patterned layer CuNO-1 on the first sidewall Cu-1c. The film thickness T2 of part of the second copper oxynitride patterned layer CuNO-2 on the second top surface Cu-2a may be substantially equal to the film thickness t2 of part of the second copper oxynitride patterned layer CuNO-2 on the second sidewall Cu-2c.

Figure 1E:
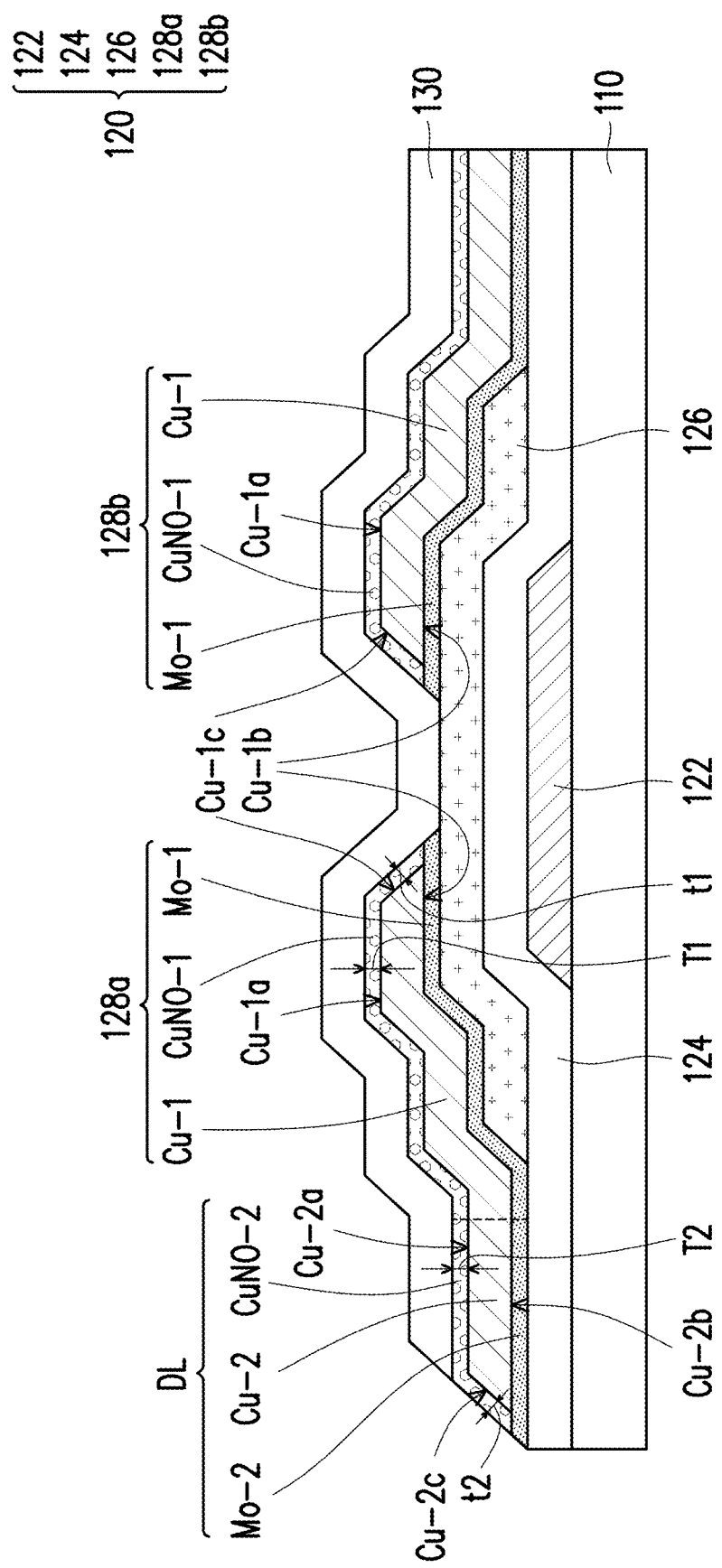

Please refer to FIG. 1E. In the embodiment, then, silane (SiH$_4$) is introduced, and the silane reacts with the nitrous oxide to form a silicon oxide layer 130. The silicon oxide layer 130 covers the source 128a and the drain 128b. The silicon oxide layer 130 covers the first copper oxynitride patterned layer CuNO-1 and the second copper oxynitride patterned layer CuNO-2, and the silicon oxide layer 130 contacts with the first copper oxynitride patterned layer CuNO-1 and the second copper oxynitride patterned layer CuNO-2. The silicon oxide layer 130 further covers part of the semiconductor pattern 126 which is not covered by the source 128a and the drain 128b.

Figure 1F:
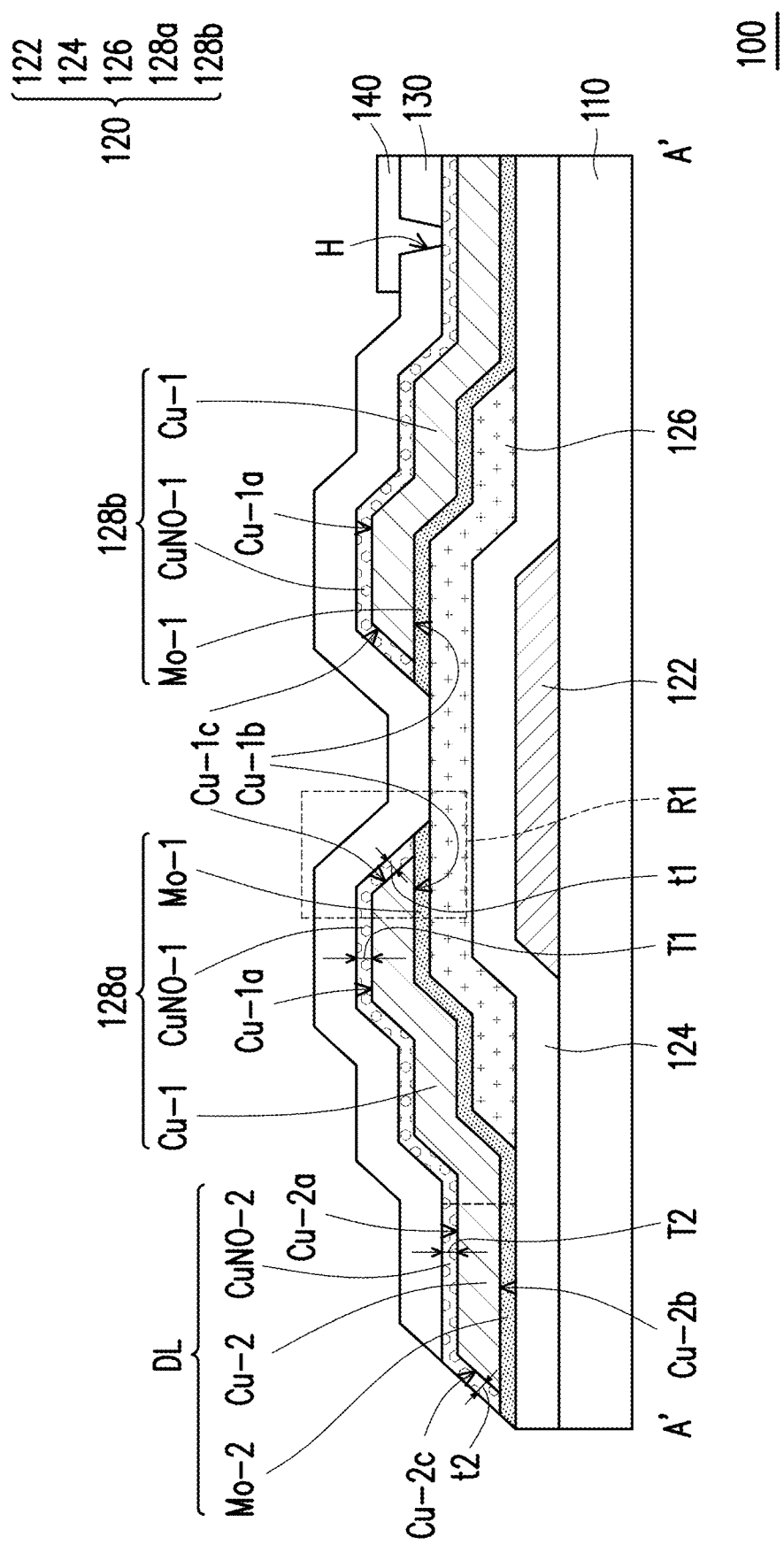

Please refer to FIG. 1F. Then, a contact window H is formed in the silicon oxide layer 130 to expose part of the drain 128b. Then, a pixel electrode 140 is formed on the silicon oxide layer 130. The pixel electrode 140 is electrically connected to the drain 128b via the contact window H. Here, a semiconductor device 100 of the embodiment is completed.

Please refer to FIG. 1F and FIG. 2. In the embodiment, the scan line SL intersects with the data line DL. It can be acquired from FIG. 2 that the scan line SL and the gate 122 belong to the same first conductive layer, and the source 128, the drain 128b and the data line DL belong to the same second conductive layer. The surface of the data line DL has the second copper oxynitride patterned layer CuNO-2. The surface of the source 128 and the surface of the drain 128b have the first copper oxynitride patterned layer CuNO-1. It should be noted that, in the embodiment, since the first copper oxynitride patterned layer CuNO-1 of the source 128a and the drain 128b and the second copper oxynitride patterned layer CuNO-2 of the data line DL have dense material structure, the first copper oxynitride patterned layer CuNO-1 of the source 128a and the drain 128b covers the first copper patterned layer Cu-1 of the source 128a and the drain 128b, and the second copper oxynitride patterned layer CuNO-2 of the data line DL covers the second copper patterned layer Cu-2 of the data line DL. Accordingly, the first copper patterned layer Cu-1 of the source 128a and the drain 128b and the second copper patterned layer Cu-2 of the data line DL are less likely to be invaded by the external moisture and thus reduce deterioration. Examples are illustrated as follows by using FIG. 3, FIG. 4, and FIG. 5.

Figure 3:
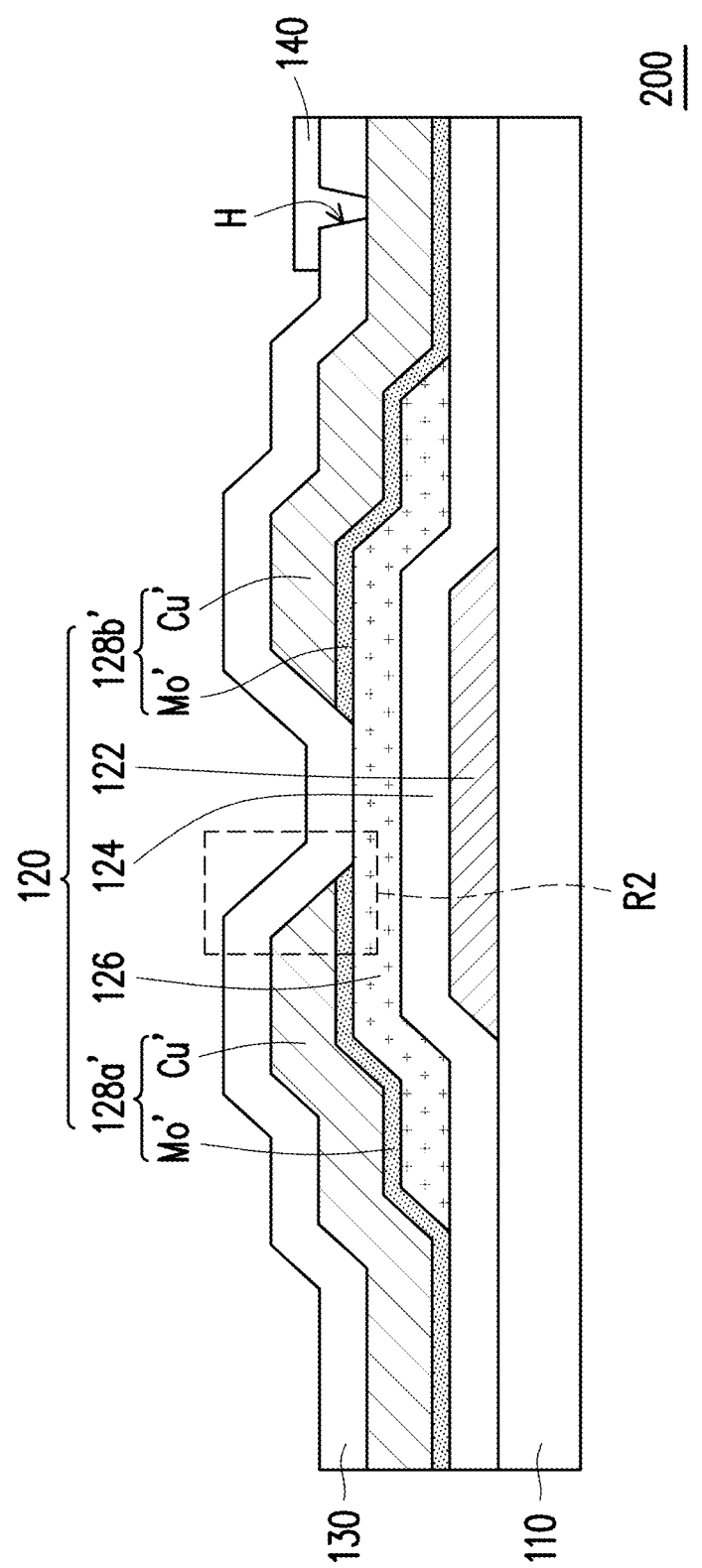
FIG. 3 is a cross-sectional schematic diagram of the semiconductor device according to a comparative example.
Figure 4:
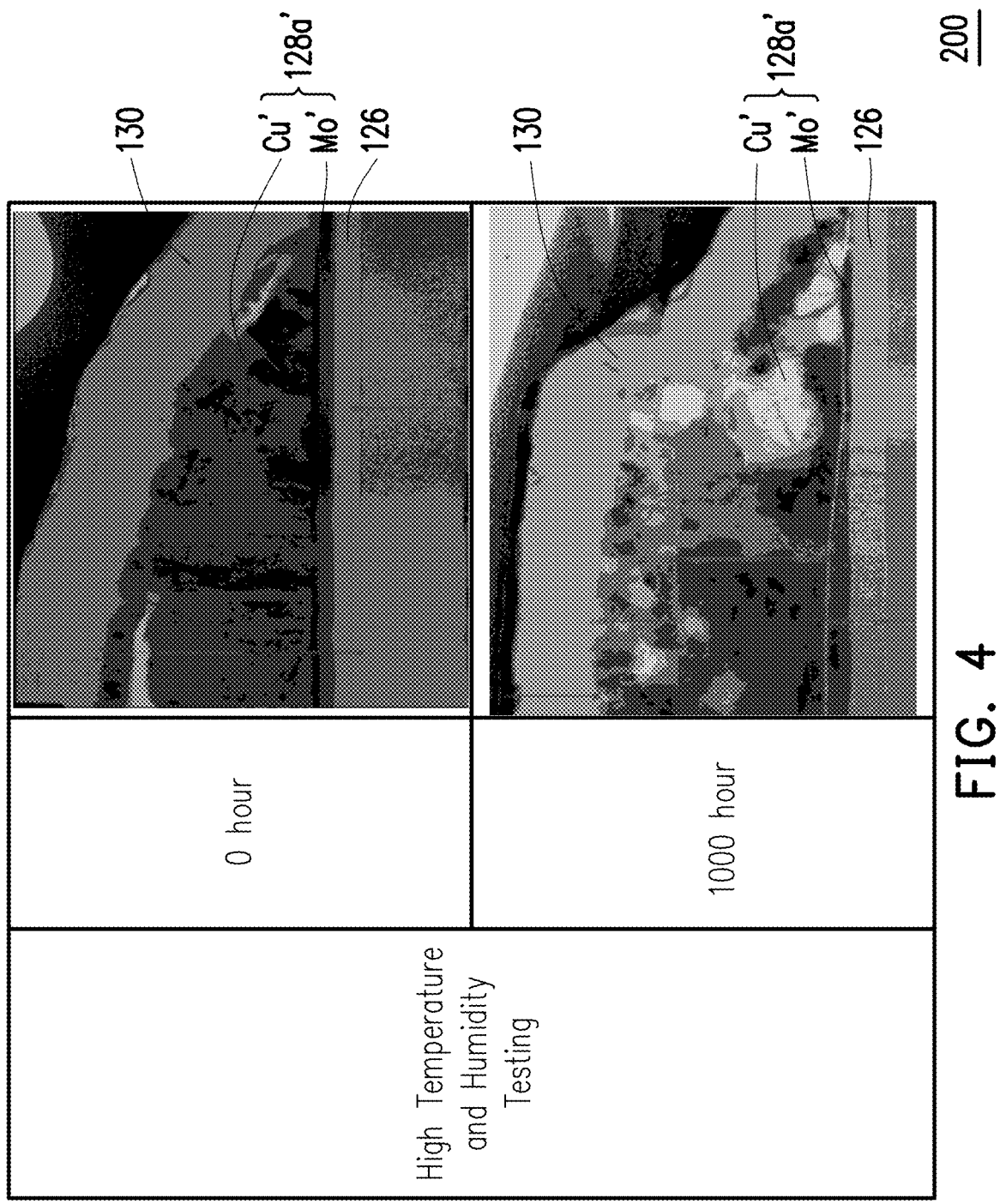
FIG. 4 is a partial sectional image of the semiconductor device under an electron microscope according to a comparative example.

FIG. 3 is a cross-sectional schematic diagram of the semiconductor device according to a comparative example. Please refer to FIG. 1F and FIG. 3. A semiconductor device 200 of the comparative example is similar to the semiconductor device 100 of the embodiment of the invention in FIG. 1F. The difference between the two is that: a source 128a' and a drain 128b' of the semiconductor device 200 are stacked by a molybdenum patterned layer Mo' and a copper patterned layer Cu'. The copper patterned layer Cu' of a comparative example fails to be covered by a copper oxynitride patterned layer. FIG. 4 is a partial sectional image of the semiconductor device under an electron microscope according to a comparative example. The partial sectional image of the semiconductor device of FIG. 4 corresponds to a partial sectional image of R2 of the semiconductor device 200 of FIG. 3.

Please refer to FIG. 4, which illustrates the partial sectional image of R2 of the semiconductor device 200 of the comparative example before undergoing a high temperature and humidity testing (as illustrated in the column of 0-hour of FIG. 4) and the partial sectional image of R2 of the semiconductor device 200 of the comparative example after undergoing a high temperature and humidity testing (as illustrated in the column of 1000-hour of FIG. 4). As illustrated in FIG. 4, owing to the adhesion differences of the copper patterned layer Cu' and the silicon oxide layer 130, after the semiconductor device 200 undergoes 1000-hour of high temperature and humidity testing, the copper patterned layer Cu' is invaded by moisture and expands around. The issue of leakage current of the thin film transistor 120 is thus generated.

Figure 5:
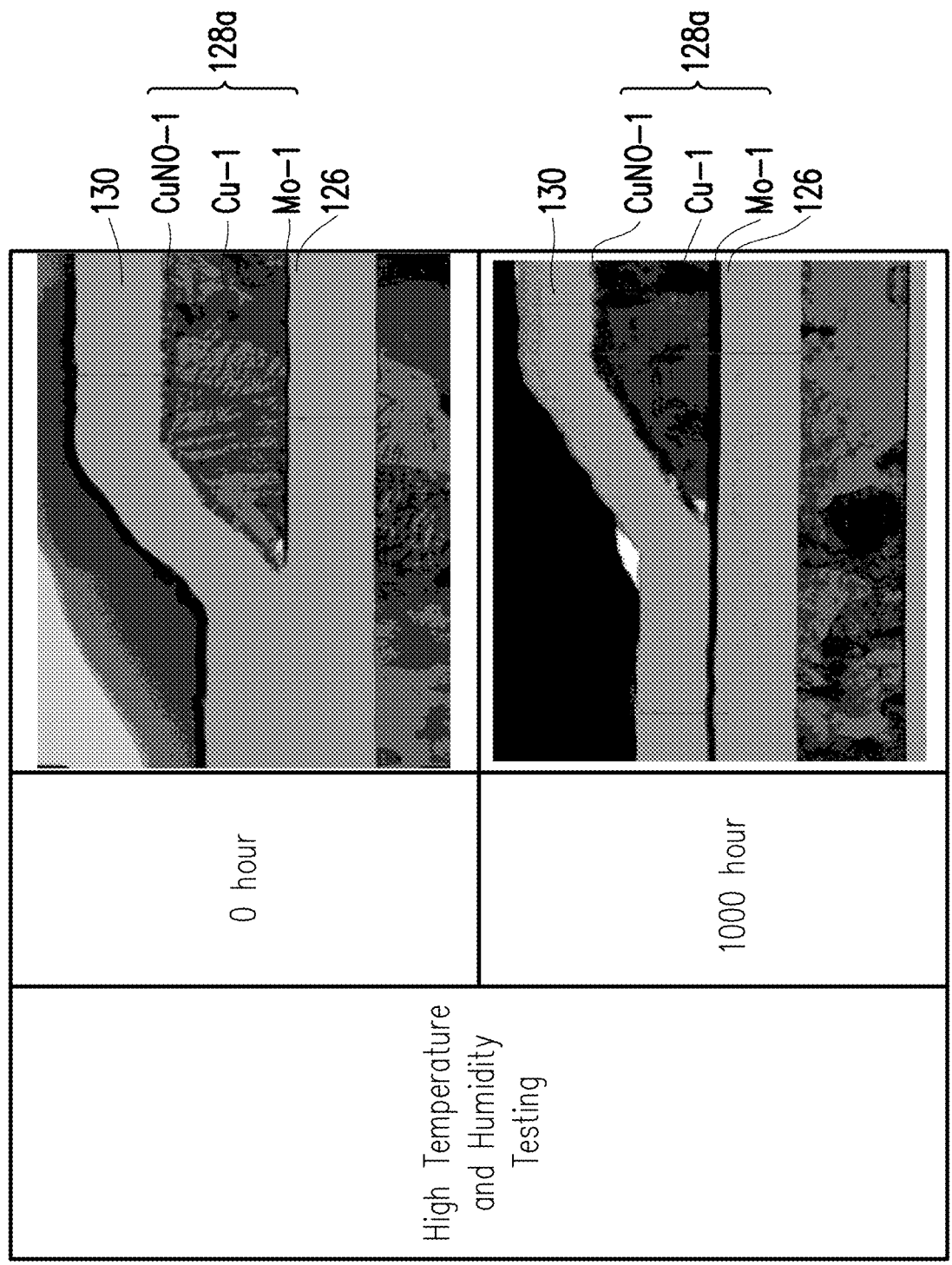
FIG. 5 is a partial sectional image of the semiconductor device under an electron microscope according to an embodiment of the invention.

FIG. 5 is a partial sectional image of the semiconductor device under an electron microscope according to an embodiment of the invention. The partial sectional image of the semiconductor device of FIG. 5 corresponds to a partial sectional image R1 of the semiconductor device 100 of FIG. 1F. Please refer to FIG. 5, which illustrates the partial sectional image R1 of the semiconductor device 100 of the comparative example before undergoing a high temperature and humidity testing (as illustrated in the column of 0-hour of FIG. 5) and the partial sectional image R1 of the semiconductor device 100 of the comparative example after undergoing a high temperature and humidity testing (as illustrated in the column of 1000-hour of FIG. 5). As illustrated in FIG. 5, since the adhesion of the copper oxynitride patterned layer (including the first copper oxynitride patterned layer CuNO-1 and the second copper oxynitride patterned layer CuNO-2) and the silicon oxide layer 130 are excellent, after the semiconductor device 100 undergoes the 1000-hour high temperature and humidity testing, the copper patterned layer (including the first copper patterned layer Cu-1 and the second copper patterned layer Cu-2) is less likely to be invaded by moisture, and the issue of leakage of the thin film transistor 120 is less likely to be generated. The reliability of the semiconductor device 100 of the embodiment is excellent.

In summary of the foregoing, in the semiconductor device of the embodiment of the invention and the manufacturing method thereof, the surface of at least one of the source and the drain has the copper oxynitride patterned layer, and/or the surface of the data line has the copper oxynitride patterned layer, as the copper oxynitride patterned layer has dense material properties, and/or the adhesion of the copper oxynitride patterned layer and the silicon oxide layer is excellent. Accordingly, it is less likely for the external moisture to invade the copper patterned layer of the at least one of the source and the drain. Therefore, the reliability of the semiconductor device of the embodiment of the invention is excellent.

Although the invention is disclosed as the embodiments above, the embodiments are not meant to limit the invention. any person skilled in the art may make slight modifications and variations without departing from the spirit and scope of the invention. Therefore, the protection scope of the invention shall be defined by the claims attached below.

What is claimed is:

1. A manufacturing method of a semiconductor device, comprising:
   providing a first substrate;
   forming a gate, a first insulating layer, and a semiconductor pattern on the first substrate, wherein the first insulating layer is disposed between the gate and the semiconductor pattern;
   forming a copper material layer on the first substrate by using a physical vapor deposition;
   introducing nitrogen to form a copper nitride material layer on the copper material layer;
   patterning the copper material layer and the copper nitride material layer to form a first copper material layer and a first copper nitride material layer; and
   introducing nitrous oxide to form a first copper oxynitride patterned layer and a first copper patterned layer, the first copper oxynitride patterned layer covering the first copper patterned layer, wherein the first copper patterned layer and the first copper oxynitride patterned layer comprise a source and a drain, and the source and the drain are separated from each other and disposed corresponding to the semiconductor pattern.

2. The manufacturing method of the semiconductor device according to claim 1, further comprising:
   introducing silane after forming the first copper oxynitride patterned layer, the silane reacting with the nitrous oxide to form a silicon oxide layer, wherein the silicon oxide layer covers the source and the drain.

3. The manufacturing method of the semiconductor device according to claim 1, wherein the first copper patterned layer is formed with a first top surface, a first bottom surface, and a first sidewall connected between the first bottom surface and the first top surface, and the first copper oxynitride patterned layer covers the first top surface and the first sidewall.

4. The manufacturing method of the semiconductor device according to claim 1, further comprising:
   forming a metal material layer on the first substrate by using the physical vapor deposition before forming the copper material layer on the first substrate; and
   patterning the metal material layer along with along patterning the copper material layer and the copper nitride material layer to form a first metal patterned layer, wherein the first copper patterned layer is disposed between the first copper oxynitride patterned layer and the first metal patterned layer.

5. The manufacturing method of the semiconductor device according to claim 4, wherein the metal material layer is the molybdenum material layer and the first metal patterned layer is the first molybdenum patterned layer.

6. The manufacturing method of the semiconductor device according to claim 1, wherein the step of patterning the copper material layer and the copper nitride material layer to form the first copper material layer and the first copper nitride material layer further comprising:
   patterning the copper material layer and the copper nitride material layer to form a second copper material layer and a second copper nitride material layer; and
   introducing the nitrous oxide to form a second copper oxynitride patterned layer and a second copper patterned layer, wherein the second copper oxynitride patterned layer covers the second copper patterned layer, and the second copper patterned layer is disposed between the second copper oxynitride patterned layer and the first substrate, wherein the second copper patterned layer and the second copper oxynitride patterned layer consist a data line, and data line is electrically connected to the source.

7. The manufacturing method of the semiconductor device according to claim 5, wherein the second copper patterned layer is formed with a second top surface, a second bottom surface and a second sidewall connected between the second bottom surface and the second top surface, and the second copper oxynitride patterned layer covers the second top surface and the second sidewall.

8. The manufacturing method of the semiconductor device according to claim 1, wherein the first copper oxynitride patterned layer directly contacts with the first copper patterned layer.

9. The manufacturing method of the semiconductor device according to claim 1, further comprising:
   forming a pixel electrode to electrically connected to the drain.

* * * * *